US007372382B2

(12) United States Patent
Hazucha et al.

(10) Patent No.: US 7,372,382 B2
(45) Date of Patent: May 13, 2008

(54) VOLTAGE REGULATION USING DIGITAL VOLTAGE CONTROL

(75) Inventors: Peter Hazucha, Beaverton, OR (US); Saravanan Rajapandian, New York, NY (US); Gerhard Schrom, Hillsboro, OR (US); Tanay Karnik, Portland, OR (US); Vivek De, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/167,978

(22) Filed: Jun. 27, 2005

(65) Prior Publication Data

US 2006/0290547 A1 Dec. 28, 2006

(51) Int. Cl.
*H03M 1/00* (2006.01)

(52) U.S. Cl. ...................................... 341/110; 341/155

(58) Field of Classification Search ........ 341/110-160; 327/540; 323/268; 360/78.04, 78
See application file for complete search history.

(56) References Cited

U.S. PATENT DOCUMENTS 5,182,526 A * 1/1993 Nelson ........................ 330/257
5,485,077 A * 1/1996 Werrbach ................... 323/286
5,610,604 A * 3/1997 Leacock et al. ............ 341/138
5,638,022 A * 6/1997 Eatwell ....................... 327/551
5,684,650 A * 11/1997 Kadlec et al. ........... 360/77.06
5,914,830 A * 6/1999 Kadlec et al. ........... 360/78.14
6,266,532 B1 * 7/2001 Austin ........................ 455/453
6,347,018 B1 * 2/2002 Kadlec et al. ........... 360/77.08
6,420,983 B1 * 7/2002 Feygin et al. ............... 341/118
6,608,503 B2 * 8/2003 Shenai et al. ................. 327/77
6,653,891 B1 11/2003 Hazucha
6,812,875 B2 * 11/2004 Shimizu ..................... 341/144
6,838,781 B2 * 1/2005 van de Loo ............. 290/40 B
6,940,434 B2 * 9/2005 Brooks ....................... 341/131
2005/0127756 A1 6/2005 Shepard et al.

OTHER PUBLICATIONS den Besten, Gerrit W., et al., "Embedded 5 V-to-3.3 V Voltage Regulator For Supplying Digital IC's In 3.3 V CMOS Technology", IEEE Journal of Solid-State Circuits, vol. 33, No. 7, pp. 956-962 (Jul. 1998).
Hazucha, Peter, et al., "An Area-Efficient, Integrated, Linear Regulator With Ultra-Fast Load Regulation", 2004 Symposium on VLSI Circuits, Digest of Technical Papers, pp. 218-221 (Jun. 17-19, 2004).
Hazucha, Peter, et al., "Area-Efficient Linear Regulator With Ultra-Fast Load Regulation", IEEE Journal of Solid-State Circuits, vol. 40, No. 4, pp. 933-940 (Apr. 2005).
U.S. Appl. No. 10/835,066, entitled High-Speed, Dual-Loop Push-Pull Voltage Regulator, by Saravanan Rajapandian, Peter Hazucha, and Tanay Karnik, filed Apr. 30, 2004.
U.S. Appl. No. 10/930,200, entitled Voltage Regulator, by Saravanan Rajapandian, Peter Hazucha, and Tanay Karnik, filed Aug. 31, 2004.

(Continued)

*Primary Examiner*—Lam T. Mai

(57) ABSTRACT

For one disclosed embodiment, error is sensed in a voltage at an output node. One or more analog signals are generated based on the sensed error. One or more generated analog signals are converted into one or more digital signals. The voltage at the output node is controlled in response to the one or more digital signals.

13 Claims, 9 Drawing Sheets

OTHER PUBLICATIONS

Rajapandian, Saravanan, et al., "Energy-Efficient Low-Voltage Operation of Digital CMOS Circuits Through Charge-Recycling", 2004 Symposium on VLSI Circuits, Digest of Technical Papers, pp. 330-333 (Jun. 17-19, 2004).

Rajapandian, Saravanan, et al., "High-Tension Power Delivery: Operating 0.18?m CMOS Digital Logic at 5.4V", 2005 IEEE International Solid-State Circuits Conference, Digest of Technical Papers, pp. 298-299, 599 (Feb. 6-10, 2005).

Rajapandian, Saravanan, et al., "Implicit DC-DC Downconversion Through Charge-Recycling", IEEE Journal of Solid-State Circuits, vol. 40, No. 4, pp. 846-852 (Apr. 2005).

* cited by examiner

VOLTAGE REGULATION USING DIGITAL VOLTAGE CONTROL

FIELD

Embodiments described in this patent application generally relate to voltage regulation.

BACKGROUND

Voltage regulators may be used, for example, to provide different supply voltage signals to different portions of an integrated circuit. A voltage regulator may, for example, receive a supply voltage signal from a power supply external to the integrated circuit and convert the supply voltage signal into a lower supply voltage signal for use by a portion of the integrated circuit. Designing portions of an integrated circuit to operate using lower supply voltage signals helps reduce power consumption of the integrated circuit.

Some prior linear voltage regulators use an analog output stage to output a supply voltage signal to a load on an integrated circuit. Such a regulator modulates an analog voltage signal input to the gate of driver transistor(s) to help maintain a relatively steady voltage level of the supply voltage signal as the load varies. A required current efficiency of the regulator, however, limits the speed at which the regulator may respond to load variations. As one example, a regulator may have only 10 milliamperes (mA) of quiescent current available to output up to 1 ampere (A) of current. Because the driver transistor(s) of the regulator are sized to deliver the maximum output current, or 1 A in this example, and are therefore relatively large, the speed at which the regulator responds to load variations can be relatively slow. Modulating the input analog voltage signal using an analog buffer may also draw available quiescent current a substantial amount of the time the regulator is operating.

BRIEF DESCRIPTION OF THE DRAWINGS

Embodiments are illustrated by way of example and not limitation in the figures of the accompanying drawings, in which like references indicate similar elements and in which.

DETAILED DESCRIPTION

The following detailed description sets forth example embodiments of methods, apparatuses, and systems relating to voltage regulation using digital voltage control. Features, such as structure(s), function(s), and/or characteristic(s) for example, are described with reference to one embodiment as a matter of convenience; various embodiments may be implemented with any suitable one or more described features.

Figure 1:
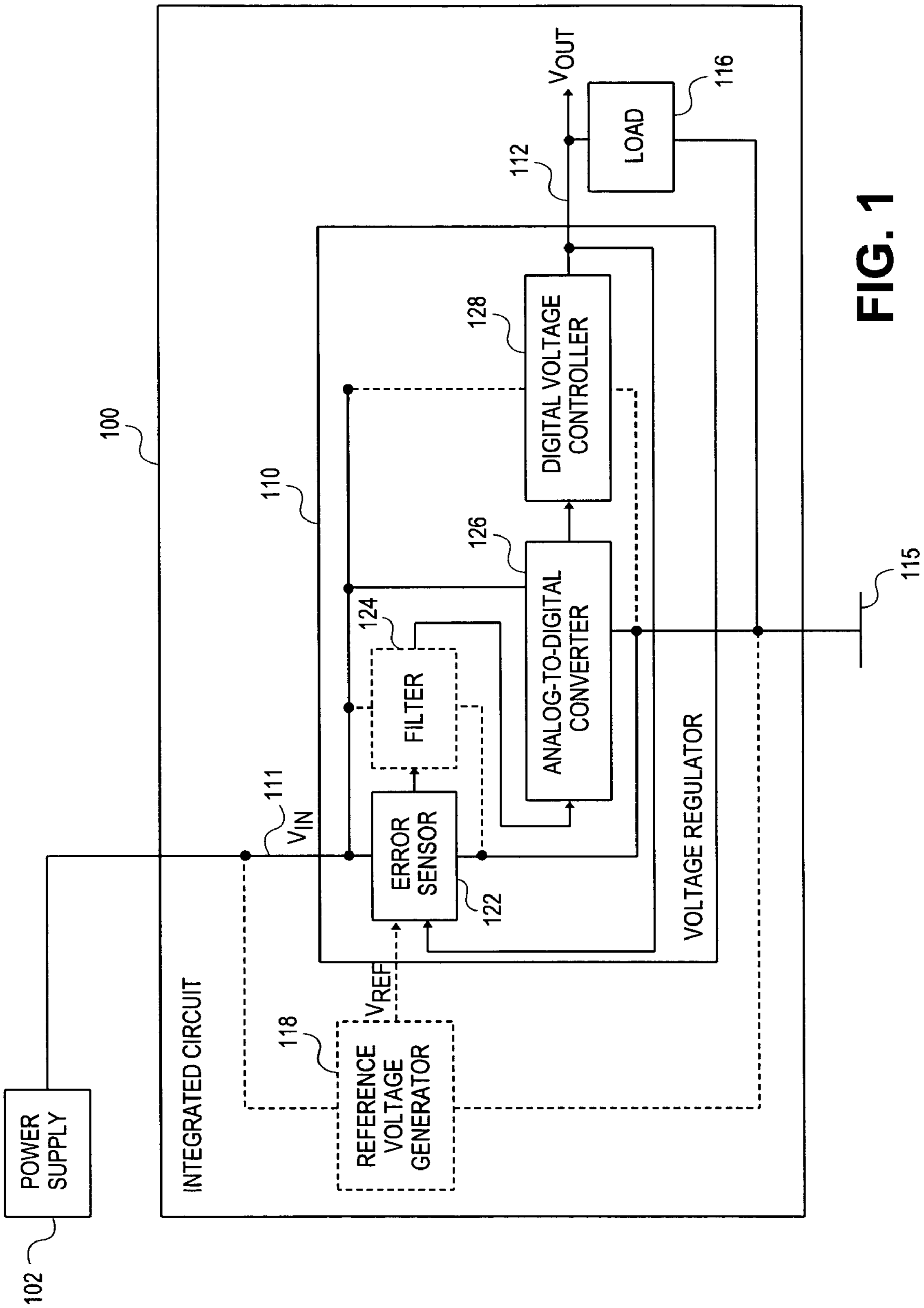
FIG. 1 illustrates, for one embodiment, a block diagram of an integrated circuit comprising a voltage regulator with digital voltage control.

FIG. 1 illustrates, for one embodiment, an integrated circuit 100 having a voltage regulator 110 with digital voltage control. Voltage regulator 110 may be coupled to receive an input supply voltage $V_{IN}$ signal at a supply node 111 and a reference supply voltage signal, such as a ground signal for example, at a supply node 115 and supply a regulated output supply voltage $V_{OUT}$ signal at an output node 112 to one or more circuits, represented by load 116, of integrated circuit 100. Voltage regulator 110 may be used for alternating current (AC) voltage regulation and/or direct current (DC) voltage regulation.

Voltage regulator 110 for one embodiment may also be coupled to receive a reference voltage $V_{REF}$ signal from a reference voltage generator 118 to supply a regulated output supply voltage $V_{OUT}$ signal based on the reference voltage $V_{REF}$ signal. Voltage regulator 110 for one embodiment may help supply a regulated output supply voltage $V_{OUT}$ signal substantially equal to the reference voltage $V_{REF}$ signal. Although illustrated on integrated circuit 100, reference voltage generator 118 for another embodiment may be external to integrated circuit 100.

Integrated circuit 100 for one embodiment may be coupled to an external power supply 102 to generate the input supply voltage $V_{IN}$ signal at supply node 111. Integrated circuit 100 for one embodiment may be coupled to any suitable reference voltage supply, such as ground for example, to provide the reference supply voltage signal at supply node 115. Although described as being coupled to supply nodes 111 and 115, voltage regulator 110 may be coupled to any suitable supply nodes.

Voltage regulator 110 for one embodiment may help maintain the output supply voltage $V_{OUT}$ signal at output node 112 despite the circuit(s) of load 116 drawing varying amounts of current from and/or supplying varying amounts of current to voltage regulator 110. Voltage regulator 110 for one embodiment may use digital voltage control, for example, to help respond to such variations of load 116 faster for a given current efficiency or to help improve current efficiency of voltage regulator 110. Voltage regulator 110 for one embodiment may be used to supply the output supply voltage $V_{OUT}$ signal to one or more circuits with relatively small decoupling capacitance.

Voltage Regulator

Figure 2:
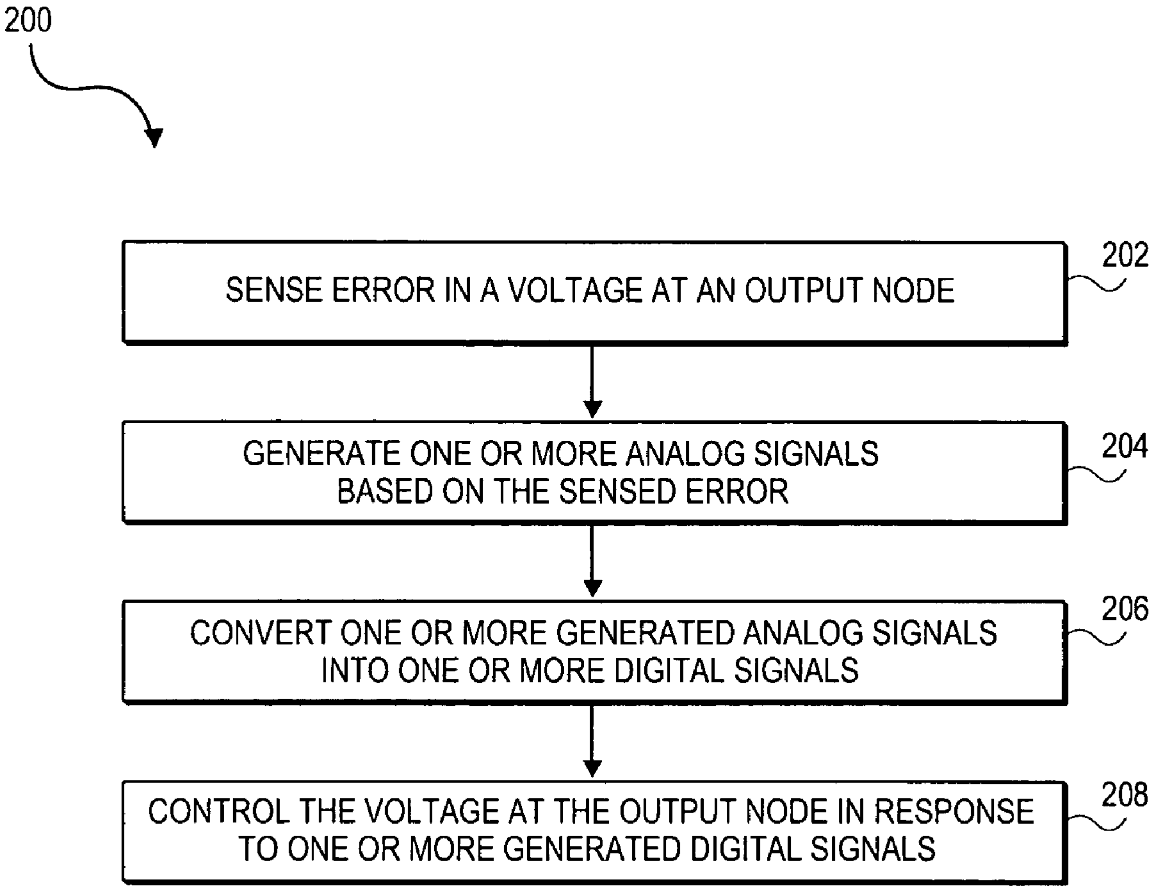
FIG. 2 illustrates, for one embodiment, a flow diagram to regulate voltage using digital voltage control.

Voltage regulator 110 for one embodiment, as illustrated in FIG. 1, may comprise an error sensor 122, an analog-to-digital converter 126, and a digital voltage controller 128 and may operate in accordance with a flow diagram 200 of FIG. 2.

For block 202 of FIG. 2, error sensor 122 may sense error in a voltage at output node 112. Error sensor 122 for one embodiment may be coupled to receive the output supply voltage $V_{OUT}$ signal at output node 112.

Error sensor 122 for one embodiment may be coupled to receive a reference voltage $V_{REF}$ signal from reference voltage generator 118 and compare a voltage corresponding to the output supply voltage $V_{OUT}$ signal to a reference voltage corresponding to the reference voltage $V_{REF}$ signal to sense error in the output supply voltage $V_{OUT}$ signal. Error sensor 122 for one embodiment may compare the output supply voltage $V_{OUT}$ signal or a voltage signal derived from the output supply voltage $V_{OUT}$ signal to the reference voltage $V_{REF}$ signal or a voltage signal derived from the reference voltage $V_{REF}$ signal and substantially sense the difference between such compared signals (e.g., $V_{REF}-V_{OUT}$) to sense error.

For block 204 of FIG. 2, error sensor 122 may generate one or more analog signals based on the sensed error. Error sensor 122 for one embodiment may generate one analog voltage signal representative of the sensed error. Error sensor 122 for one embodiment may generate two analog voltage signals representative of the sensed error. Error sensor 122 for one embodiment may amplify one or more analog signals representative of the sensed error.

Error sensor 122 may comprise any suitable circuitry to sense error in the output supply voltage $V_{OUT}$ signal in any suitable manner and to generate any suitable number of one or more analog signals based on the sensed error in any suitable manner. Error sensor 122 for one embodiment may comprise an error amplifier. Error sensor 122 for one embodiment may comprise a differential error amplifier. Error sensor 122 for one embodiment may comprise a self-biased error amplifier. Error sensor 122 for one embodiment may comprise a dual output error amplifier.

For block 206 of FIG. 2, analog-to-digital converter 126 may convert one or more analog signals generated for block 204 into one or more digital signals. Analog-to-digital converter 126 for one embodiment may be coupled to receive one or more analog signals from error sensor 122.

Analog-to-digital converter 126 for one embodiment may convert one or more analog signals into digital signals representative of a thermometer code.

Analog-to-digital converter 126 may comprise any suitable circuitry to convert one or more received analog signals into any suitable number of one or more digital signals in any suitable manner. Analog-to-digital converter 126 for one embodiment may comprise a flash analog-to-digital converter. Analog-to-digital converter 126 for one embodiment may comprise a resistive network to generate analog signals in response to one or more analog signals from error sensor 122 and a plurality of buffers to generate digital signals in response to analog signals generated from the resistive network.

Analog-to-digital converter 126 for one embodiment may be coupled to receive one or more analog signals from error sensor 122 through an optional filter 124. Filter 124 may be coupled to receive one or more analog signals from error sensor 122 and may comprise any suitable circuitry to filter one or more received analog signals in any suitable manner. Filter 124 for one embodiment may filter received analog signal(s) to limit operation of voltage regulator 110 to certain frequency bands for alternating current (AC) voltage regulation. Filter 124 for one embodiment may filter received analog signal(s) to remove a direct current (DC) component for AC-only voltage regulation. Filter 124 for one embodiment may filter received analog signal(s) to remove a direct current (DC) component and one or more frequency components for AC-only voltage regulation.

For block 208 of FIG. 2, digital voltage controller 128 may control the voltage at output node 112 in response to one or more digital signals generated for block 206. Digital voltage controller 128 for one embodiment may be coupled to receive one or more digital signals from analog-to-digital converter 126.

Digital voltage controller 128 for one embodiment may help control the voltage at output node 112 by generating current at output node 112 in response to one or more digital signals from analog-to-digital converter 126. For one embodiment where one or more digital signals from analog-to-digital converter 126 are generally representative of the error sensed by error sensor 122, digital voltage controller 128 for one embodiment may generate at output node 112 current generally proportional to the sensed error to help reduce or eliminate error in the voltage at output node 112. For one embodiment where analog-to-digital converter 126 is coupled to receive an analog voltage signal from error sensor 122, analog-to-digital converter 126 and digital voltage controller 128 for one embodiment may form a voltage-to-current (V/I) converter.

Digital voltage controller 128 for one embodiment may source current to output node 112, that is output positive current, in response to one or more digital signals. Digital voltage controller 128 for one embodiment may sink current from output node 112, that is output negative current, in response to one or more digital signals. Digital voltage controller 128 for one embodiment may either source or sink current, that is output bipolar current, in response to one or more digital signals.

Digital voltage controller 128 may comprise any suitable circuitry to control the voltage at output node 112 in response to one or more digital signals in any suitable manner. Digital voltage controller 128 for one embodiment may comprise a digital-to-analog converter. Digital voltage controller 128 for one embodiment may comprise a thermometer code digital-to-analog converter. Digital voltage controller 128 for one embodiment may comprise a plurality of transistors one or more of which may be activated in response to digital signals received from analog-to-digital converter 126 to couple output node 112 to one or more supply nodes, such as supply node 111 and/or supply node 115 for example.

Error sensor 122, analog-to-digital converter 126, and digital voltage controller 128 may or may not overlap in time the performance of any suitable operation with any other suitable operation for blocks 202-208. Because error sensor 122 for one embodiment may be coupled to receive the output supply voltage $V_{OUT}$ signal at output node 112, error sensor 122, analog-to-digital converter 126, and digital voltage controller 128 for one embodiment may define a feedback loop to monitor the output supply voltage $V_{OUT}$ signal at output node 112 as digital voltage controller 128 controls the output supply voltage $V_{OUT}$ signal. Error sensor 122, optional filter 124, analog-to-digital converter 126, and/or digital voltage controller 128 may each operate in accordance with any suitable scheme such as, for example, sporadically, at random times, at predetermined time intervals, substantially continuously, discretely at any suitable rate, and/or in response to any suitable event.

Figure 3:
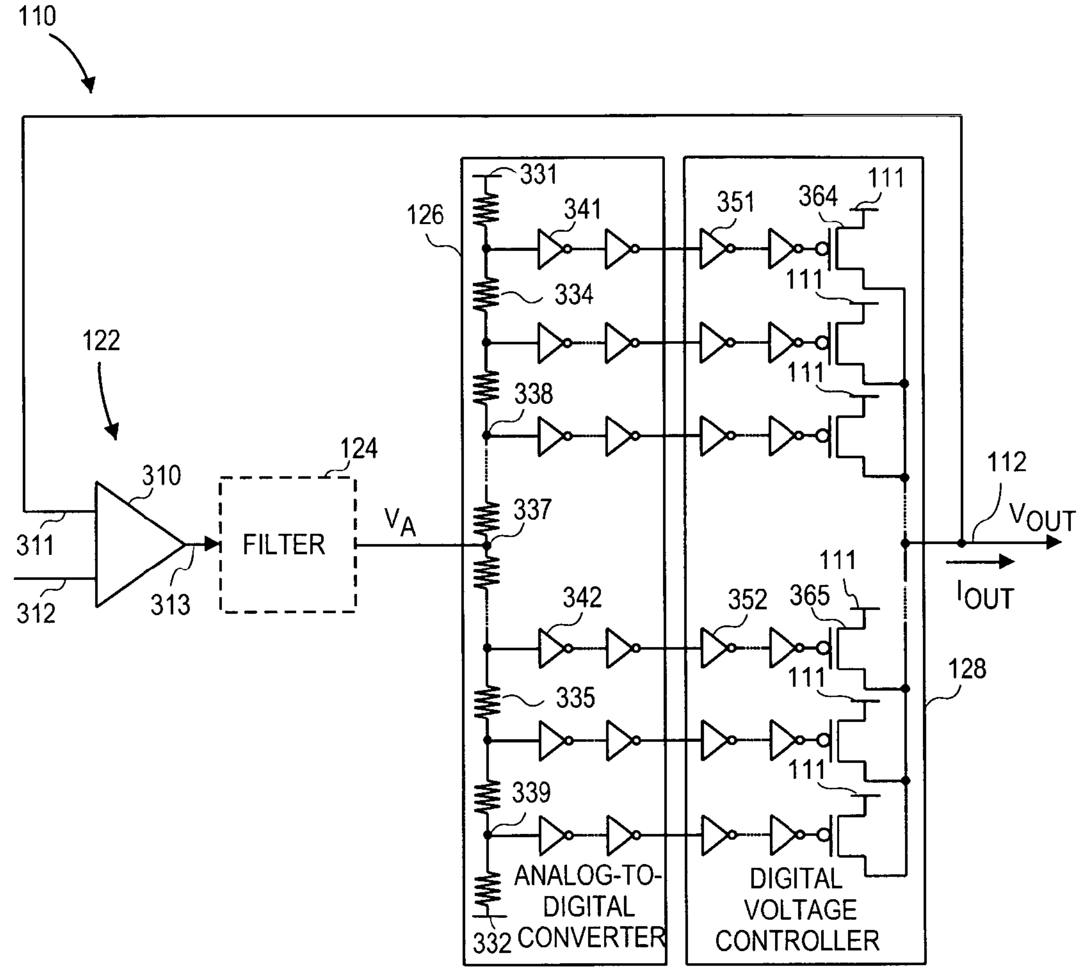
FIG. 3 illustrates, for one embodiment, example circuitry to implement an error sensor, an analog-to-digital converter, and a digital voltage controller for the voltage regulator of FIG. 1.

FIG. 3 illustrates, for one embodiment, example circuitry to implement voltage regulator 110 of FIG. 1.

Error Sensor

As illustrated in FIG. 3, error sensor 122 for one embodiment may comprise circuitry to implement a differential error amplifier 310. An input terminal 311 of differential error amplifier 310 may be coupled to receive the output supply voltage $V_{OUT}$ signal at output node 112 and another input terminal 312 of differential error amplifier 310 may be coupled to receive a reference voltage $V_{REF}$ signal supplied by reference voltage generator 118. Differential error amplifier 310 may comprise any suitable circuitry to sense the difference in voltage between the output supply voltage $V_{OUT}$ signal and the reference voltage $V_{REF}$ signal and generate at an output terminal 313 an amplified analog voltage signal representative of the difference.

Figure 4:
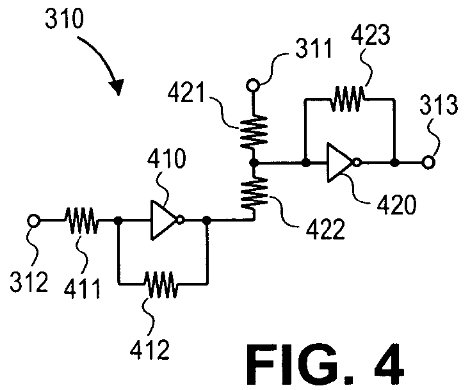
FIG. 4 illustrates, for one embodiment, example circuitry to implement a differential error amplifier for the error sensor of FIG. 3.

Differential error amplifier 310 for one embodiment, as illustrated in FIG. 4, may comprise inverters 410 and 420 and resistors 411, 412, 421, 422, and 423. Resistor 411 may be coupled in series between input terminal 312 and the input of inverter 410, and resistor 412 may be coupled across the input and output of inverter 410. Inverter 410 may be coupled to receive the reference voltage $V_{REF}$ signal at input terminal 312. Resistors 421 and 422 may be coupled to form a voltage divider between input terminal 311 and the output of inverter 410, and resistor 423 may be coupled across the input and output of inverter 420. The voltage divider may be coupled to receive, for example, the output supply voltage $V_{OUT}$ signal at input terminal 311 to divide the difference between the output supply voltage $V_{OUT}$ signal and a voltage signal at the output of inverter 410 to generate a divided voltage signal. Inverter 420 may be coupled to receive the divided voltage signal and to generate at output terminal 313 an amplified analog voltage signal representative of the difference between the output supply voltage $V_{OUT}$ signal and the reference voltage $V_{REF}$ signal in response to the divided voltage signal.

Although described as receiving the output supply voltage $V_{OUT}$ signal at input terminal 311 and the reference voltage $V_{REF}$ signal at input terminal 312, differential error amplifier 310 may receive the output supply voltage $V_{OUT}$ signal at input terminal 312 and the reference voltage $V_{REF}$ signal at input terminal 311 for another embodiment of voltage regulator 110.

Analog-to-Digital Converter

Analog-to-digital converter 126 for one embodiment may comprise circuitry to implement a flash analog-to-digital converter coupled to receive an analog voltage $V_A$ signal from error sensor 122 and to generate and output digital signals for digital voltage controller 128 in response to the received analog voltage $V_A$ signal. Analog-to-digital converter 126 for one embodiment may comprise circuitry to generate and output digital signals representative of a thermometer code in response to the received analog voltage $V_A$ signal.

Analog-to-digital converter 126 for one embodiment may comprise a resistive network coupled to receive an analog voltage $V_A$ signal from error sensor 122 to generate analog voltage signals in response to the received analog voltage $V_A$ signal. Analog-to-digital converter 126 for one embodiment may also comprise a plurality of buffers coupled to receive analog signals from the resistive network to generate digital signals in response to the received analog signals. Such a buffer for one embodiment may effectively act as a comparator with a comparison level equal to the buffer's voltage trip point. When the input voltage of an inverting buffer, for example, is greater than the buffer's voltage trip point, the inverting buffer outputs a relatively low voltage signal. When the input voltage of the inverting buffer, for example, is less than the buffer's voltage trip point, the inverting buffer outputs a relatively high voltage signal. Buffers for one embodiment may be implemented using complementary metal oxide semiconductor (CMOS) technology and exhibit relatively high gain in the vicinity of a buffer's voltage trip point. For one embodiment where error sensor 122 comprises an error amplifier, buffers for one embodiment may have a voltage trip point that generally matches the bias point of the error amplifier to help reduce offset due to limited loop gain.

Analog-to-digital converter 126 for one embodiment may comprise buffers coupled to receive analog signals generated from one or more resistive trees driven by the analog voltage $V_A$ signal from error sensor 122. For one embodiment, as illustrated in FIG. 3, analog-to-digital converter 126 may comprise buffers, such as inverting buffers 341 and 342 for example, coupled to receive analog signals generated from two resistive trees coupled in series between supply nodes 331 and 332. The two resistive trees may be coupled to receive the analog voltage $V_A$ signal at an input node 337 between the two resistive trees.

One resistive tree for one embodiment may comprise a plurality of resistors, such as a resistor 334 for example, coupled in series between supply node 331 and input node 337 to generate one or more analog signals at one or more corresponding nodes, such as a node 338 for example, of the resistive tree in response to the received analog voltage $V_A$ signal. Another resistive tree for one embodiment may comprise a plurality of resistors, such as a resistor 335 for example, coupled in series between input node 337 and supply node 332 to generate one or more analog signals at one or more corresponding nodes, such as a node 339 for example, of the resistive tree in response to the received analog voltage $V_A$ signal. Although illustrated as having four resistors coupled in series to define three nodes at which analog signals may be generated, a resistive tree may comprise any suitable number of resistors of any suitable size to generate one or more analog signals at any suitable number of one or more nodes.

The resistances of the resistors of the resistive trees and the voltage levels at supply nodes 331 and 332 for one embodiment may have any suitable values to help trip buffers in succession as the analog voltage $V_A$ signal varies between minimum and maximum levels. In this manner, the buffers may generate digital signals representative of a thermometer code. The resistances of the resistors of the resistive trees and the voltage levels at supply nodes 331 and 332 for one embodiment may have any suitable values so the thermometer code is generally proportional to the analog voltage $V_A$ signal. The resistances of the resistors of the resistive trees and the voltage levels at supply nodes 331 and 332 for one embodiment may have any suitable values so the difference in the analog voltage $V_A$ signal to trip an additional buffer is approximately the same. Supply node 331 for one embodiment may correspond to supply node 111 of FIG. 1, and supply node 332 for one embodiment may correspond to supply node 115 of FIG. 1.

Although illustrated as having two inverting buffers coupled in series at a corresponding node of a resistive network, analog-to-digital converter 126 may comprise any suitable number of one or more non-inverting and/or inverting buffers at a corresponding node of a resistive network. Using one or more additional buffers at a corresponding node for one embodiment may help improve output drive strength of the corresponding digital signal.

Analog-to-digital converter 126 for another embodiment may comprise a plurality of differential comparators coupled to receive analog signals from a resistive network to generate digital signals in response to the received analog signals. Using buffers instead of differential comparators, however, may help improve the speed of voltage regulator 110.

Digital Voltage Controller

Digital voltage controller 128 for one embodiment may comprise circuitry to implement a digital-to-analog converter coupled to receive digital signals from analog-to-digital converter 126 and to control the output supply voltage $V_{OUT}$ signal at output node 112 in response to the received digital signals.

Digital voltage controller 128 for one embodiment may comprise, as illustrated in FIG. 3, a plurality of buffers, such as inverting buffers 351 and 352 for example, and a plurality of transistors, such as transistors 364 and 365 for example.

Buffers of digital voltage controller 128 for one embodiment may be coupled to receive digital signals from analog-to-digital converter 126 and to activate or deactivate one or more of the transistors in response to the received digital signals. Although illustrated as having two inverting buffers coupled in series to buffer a corresponding digital signal, digital voltage controller 128 for one embodiment may comprise any suitable number of one or more non-inverting and/or inverting buffers to buffer a corresponding digital signal. Using one or more buffers to buffer a corresponding digital signal for one embodiment may help improve output drive strength of the corresponding digital signal.

Digital voltage controller 128 for another embodiment may not comprise any buffer for one or more received digital signals. Rather, one or more transistors may be coupled to receive a corresponding digital signal from analog-to-digital converter 126 without buffering.

Transistors of digital voltage controller 128 for one embodiment may be coupled to couple output node 112 to a corresponding supply node when activated and decouple output node 112 from the corresponding supply node when deactivated to help source current $I_{OUT}$ to output node 112 and/or sink current $I_{OUT}$ from output node 112 and therefore help control the voltage at output node 112.

Digital voltage controller 128 for one embodiment may comprise transistors coupled to receive a corresponding digital signal from analog-to-digital converter 126. For one embodiment, the number of transistor(s) activated, if any, in response to digital signals representative of a thermometer code generally proportional to the analog voltage $V_A$ signal generated by error sensor 122 may be generally proportional to the analog voltage $V_A$ signal. Digital voltage controller 128 for one embodiment may comprise suitable transistors coupled between output node 112 and a suitable corresponding supply node to source or sink an amount of current $I_{OUT}$ generally proportional to the analog voltage $V_A$ signal in response to digital signals representative of a thermometer code generally proportional to the analog voltage $V_A$.

Allowing voltage regulator 110 to activate or deactivate only a portion of a plurality of transistors to control the voltage at output node 112 for one embodiment may help reduce the quiescent current of voltage regulator 110 and/or may help voltage regulator 110 respond to variations of load 116 faster. Voltage regulator 110 for one embodiment may therefore have an improved current efficiency for a given speed or may respond to variations of load 116 faster for a given current efficiency. This benefit may be enhanced for one embodiment where digital buffers of analog-to-digital converter 126 and/or digital voltage controller 128 may consume only relatively minimal quiescent current when not switching. Such digital buffers for one embodiment may be implemented using CMOS inverters, for example.

How digital voltage controller 128 helps control the voltage at output node 112 for one embodiment may depend, for example, on the voltage at the supply node or nodes that may be coupled to output node 112 by transistors, on the type or types of transistors used to couple the supply node(s) to output node 112, and on whether the digital signals generated in response to the analog voltage $V_A$ signal from error sensor 122 are inverted, if at all, an even or odd number of times by buffers of analog-to-digital converter 126 and/or digital voltage controller 128.

Digital voltage controller 128 for one embodiment, as illustrated in FIG. 3, may comprise p-channel field effect transistors (pFETs) coupled to couple output node 112 to supply node 111 when activated and decouple output node 112 from supply node 111 when deactivated.

Figure 5:
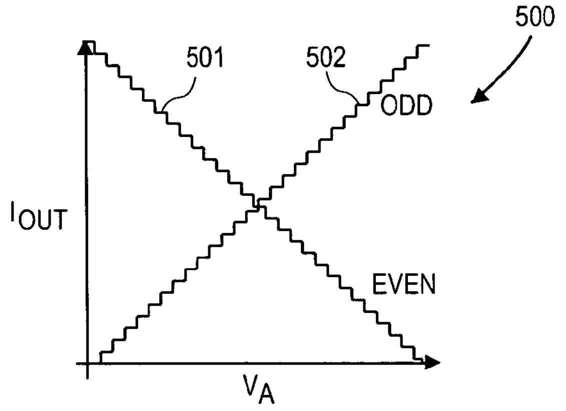
FIG. 5 illustrates an example graph of transfer functions for the circuitry of the analog-to-digital converter and the digital voltage controller of FIG. 3.

Digital voltage controller 128 for one embodiment may therefore help control the voltage at output node 112 by sourcing current $I_{OUT}$ to output node 112 in response to digital signals representative of a thermometer code corresponding to the analog voltage $V_A$ signal generated by error sensor 122 generally in accordance with a transfer function represented by a curve 501 or a curve 502 as illustrated in a graph 500 of FIG. 5. Curve 501 generally represents a transfer function for zero or an even number of inversions of such digital signals, and curve 502 generally represents a transfer function for an odd number of inversion(s) of such digital signals.

Although illustrated in FIG. 3 as having six p-channel field effect transistors (pFETs) each coupled between supply node 111 and output node 112, digital voltage controller 128 for another embodiment may comprise any suitable number of transistors of any suitable type or types to couple any suitable supply node or nodes to output node 112 when activated.

Figure 6:
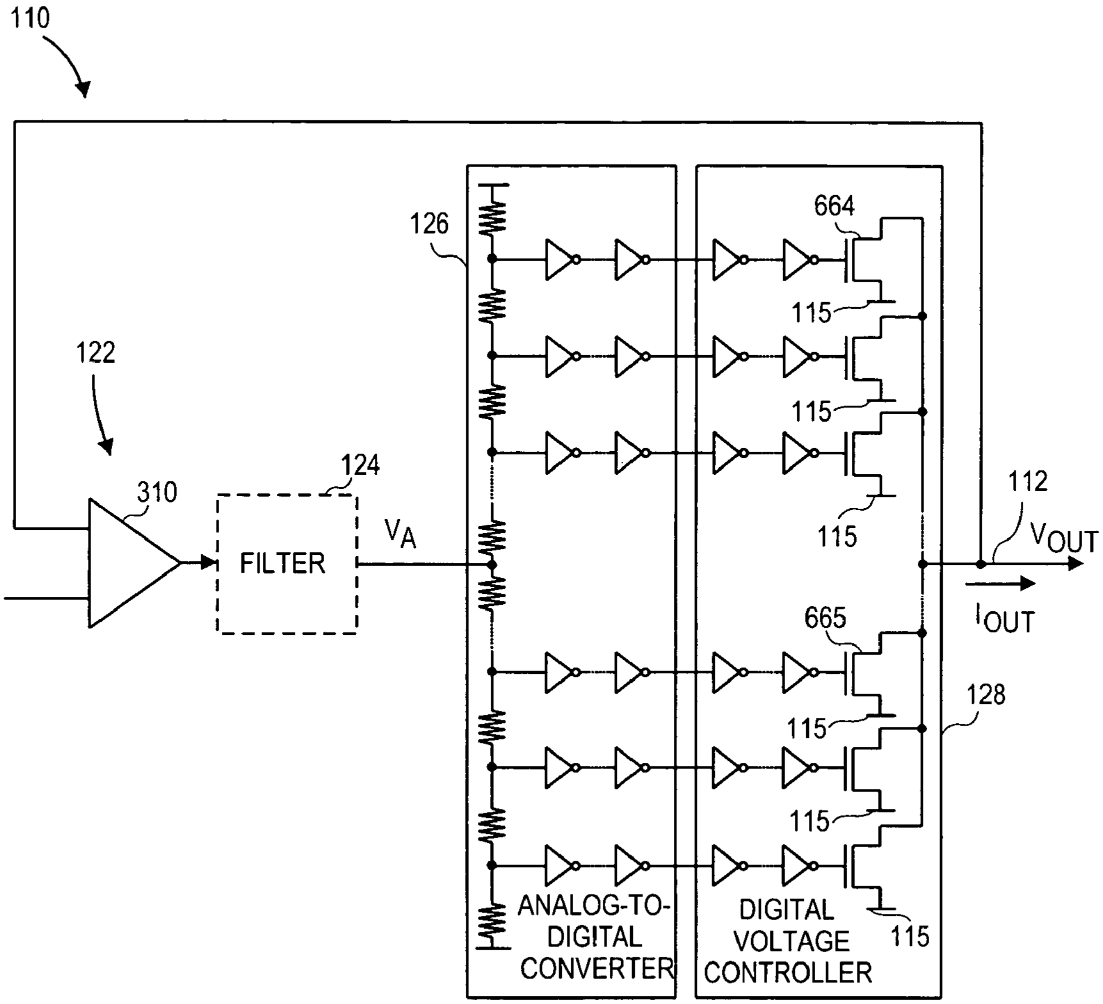
FIG. 6 illustrates, for another embodiment, example circuitry to implement an error sensor, an analog-to-digital converter, and a digital voltage controller for the voltage regulator of FIG. 1.

Digital voltage controller 128 for one embodiment, as illustrated in FIG. 6, may comprise n-channel field effect transistors (nFETs), such as nFETs 664 and 665 for example, coupled to couple output node 112 to supply node 115 when activated and decouple output node 112 from supply node 115 when deactivated.

Figure 7:
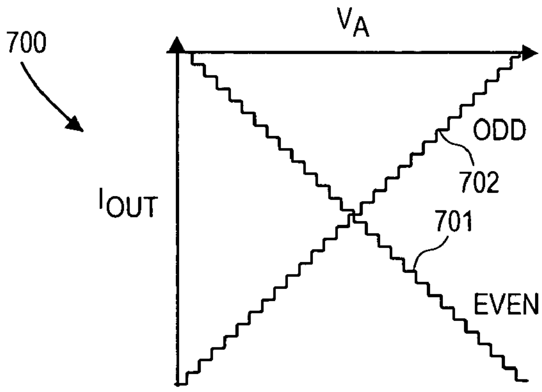
FIG. 7 illustrates an example graph of transfer functions for the circuitry of the analog-to-digital converter and the digital voltage controller of FIG. 6.

Digital voltage controller 128 for one embodiment may therefore help control the voltage at output node 112 by sinking current $I_{OUT}$ from output node 112 in response to digital signals representative of a thermometer code corresponding to the analog voltage $V_A$ signal generated by error sensor 122 generally in accordance with a transfer function represented by a curve 701 or a curve 702 as illustrated in a graph 700 of FIG. 7. Curve 701 generally represents a transfer function for zero or an even number of inversions of such digital signals, and curve 702 generally represents a transfer function for an odd number of inversion(s) of such digital signals.

Figure 8:
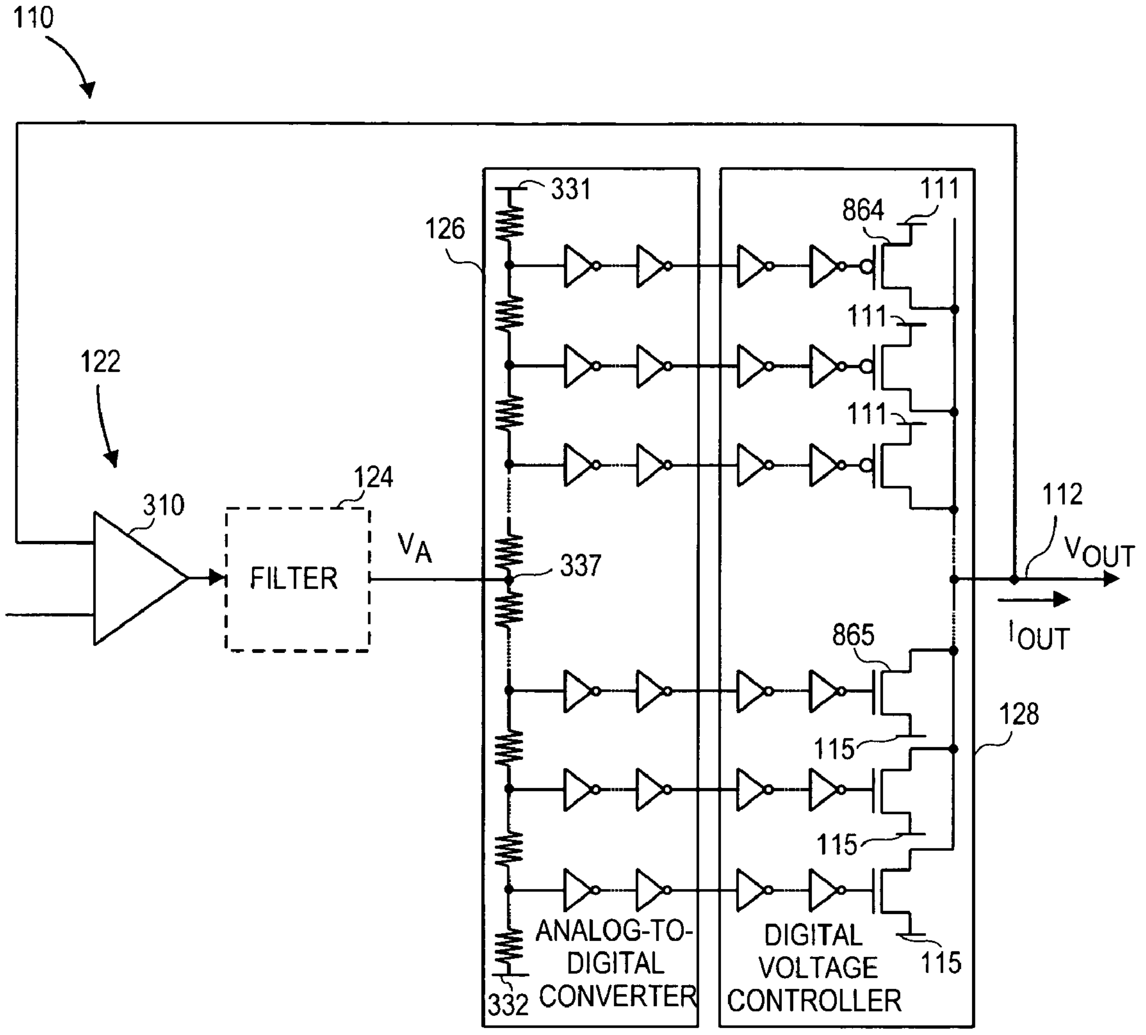
FIG. 8 illustrates, for another embodiment, example circuitry to implement an error sensor, an analog-to-digital converter, and a digital voltage controller for the voltage regulator of FIG. 1.

Digital voltage controller 128 for one embodiment, as illustrated in FIG. 8, may comprise one or more p-channel field effect transistors (pFETs), such as pFET 864 for example, coupled to couple output node 112 to supply node 111 when activated and decouple output node 112 from supply node 111 when deactivated. Such pFET(s) for one embodiment may be activated or deactivated in response to a digital signal corresponding to an intermediate node between supply node 331 and input node 337 of analog-to-digital converter 126. Such circuitry for one embodiment may also comprise one or more n-channel field effect transistors (nFETs), such as nFET 865 for example, coupled to couple output node 112 to supply node 115 when activated and decouple output node 112 from supply node 115 when deactivated. Such nFET(s) for one embodiment may be activated or deactivated in response to a digital signal corresponding to an intermediate node between input node 337 and supply node 332 of analog-to-digital converter 126.

Figure 9:
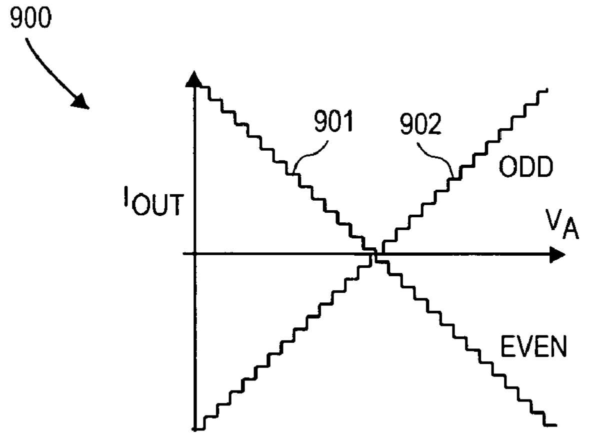
FIG. 9 illustrates an example graph of transfer functions for the circuitry of the analog-to-digital converter and the digital voltage controller of FIG. 8.

Digital voltage controller 128 for one embodiment may therefore help control the voltage at output node 112 by sourcing current $O_{OUT}$ to output node 112 or sinking current $I_{OUT}$ from output node 112 in response to digital signals representative of a thermometer code corresponding to the analog voltage $V_A$ signal generated by error sensor 122 generally in accordance with a transfer function represented by a curve 901 or a curve 902 as illustrated in a graph 900 of FIG. 9. Curve 901 generally represents a transfer function for zero or an even number of inversions of such digital signals, and curve 902 generally represents a transfer function for an odd number of inversion(s) of such digital signals.

Figure 10:
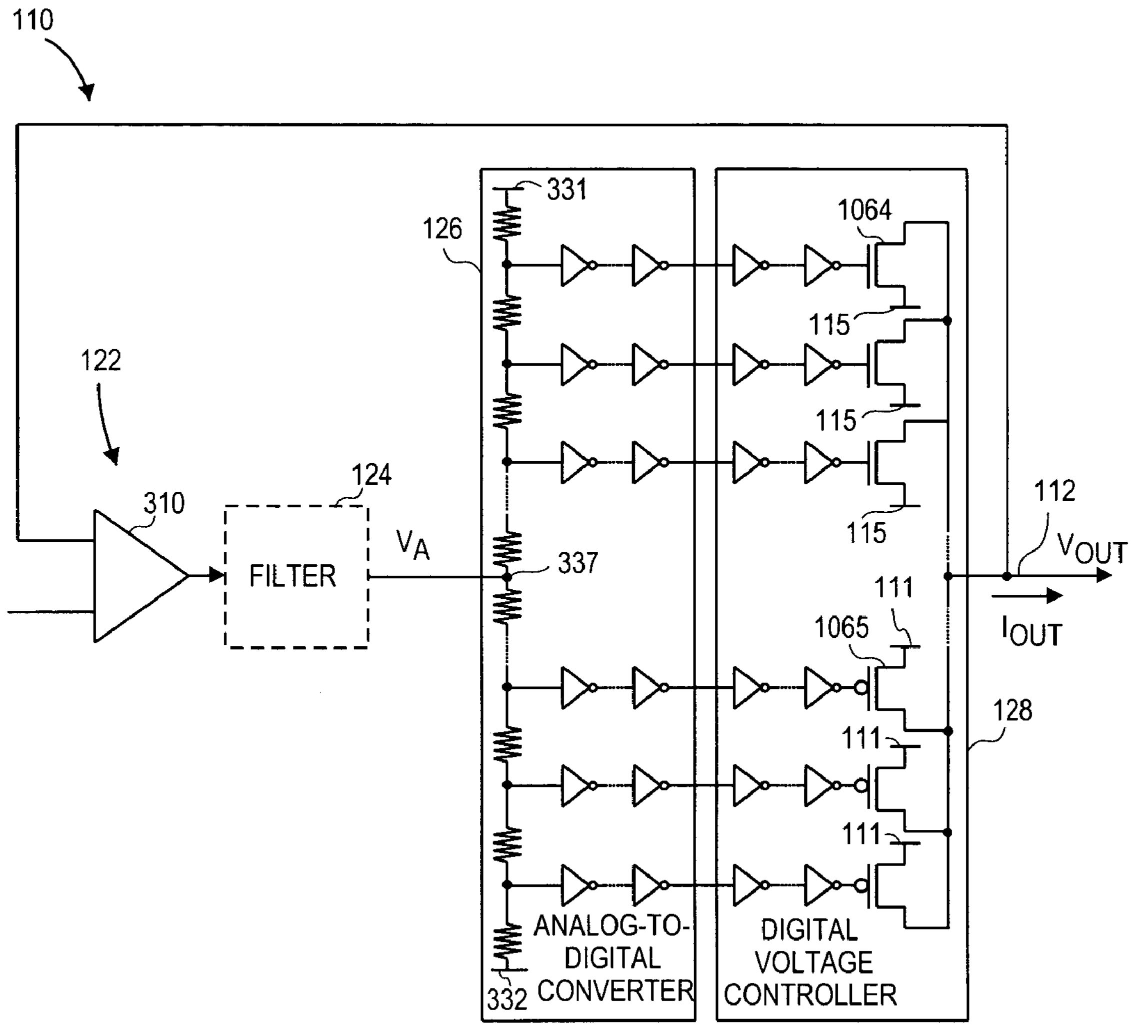
FIG. 10 illustrates, for another embodiment, example circuitry to implement an error sensor, an analog-to-digital converter, and a digital voltage controller for the voltage regulator of FIG. 1.

Digital voltage controller 128 for one embodiment, as illustrated in FIG. 10, may comprise one or more n-channel field effect transistors (nFETs), such as nFET 1064 for example, coupled to couple output node 112 to supply node 115 when activated and decouple output node 112 from supply node 115 when deactivated. Such nFET(s) for one embodiment may be activated or deactivated in response to a digital signal corresponding to an intermediate node between supply node 331 and input node 337 of analog-to-digital converter 126. Such circuitry for one embodiment may also comprise one or more p-channel field effect transistors (pFETs), such as pFET 1065 for example, coupled to couple output node 112 to supply node 111 when activated and decouple output node 112 from supply node 111 when deactivated. Such pFET(s) for one embodiment may be activated or deactivated in response to a digital signal corresponding to an intermediate node between input node 337 and supply node 332 of analog-to-digital converter 126.

Figure 11:
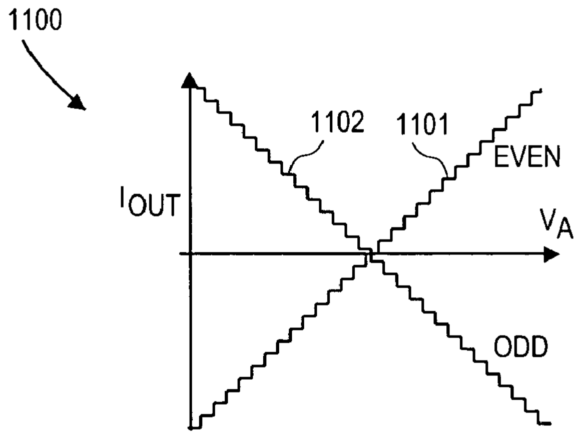
FIG. 11 illustrates an example graph of transfer functions for the circuitry of the analog-to-digital converter and the digital voltage controller of FIG. 10.

Digital voltage controller 128 for one embodiment may therefore help control the voltage at output node 112 by sourcing current $I_{OUT}$ to output node 112 or sinking current $I_{OUT}$ from output node 112 in response to digital signals representative of a thermometer code corresponding to the analog voltage $V_A$ signal generated by error sensor 122 generally in accordance with a transfer function represented by a curve 1101 or a curve 1102 as illustrated in a graph 1100 of FIG. 11. Curve 1101 generally represents a transfer function for zero or an even number of inversions of such digital signals, and curve 1102 generally represents a transfer function for an odd number of inversion(s) of such digital signals.

Alternative Analog-to-Digital Converter

Figure 12:
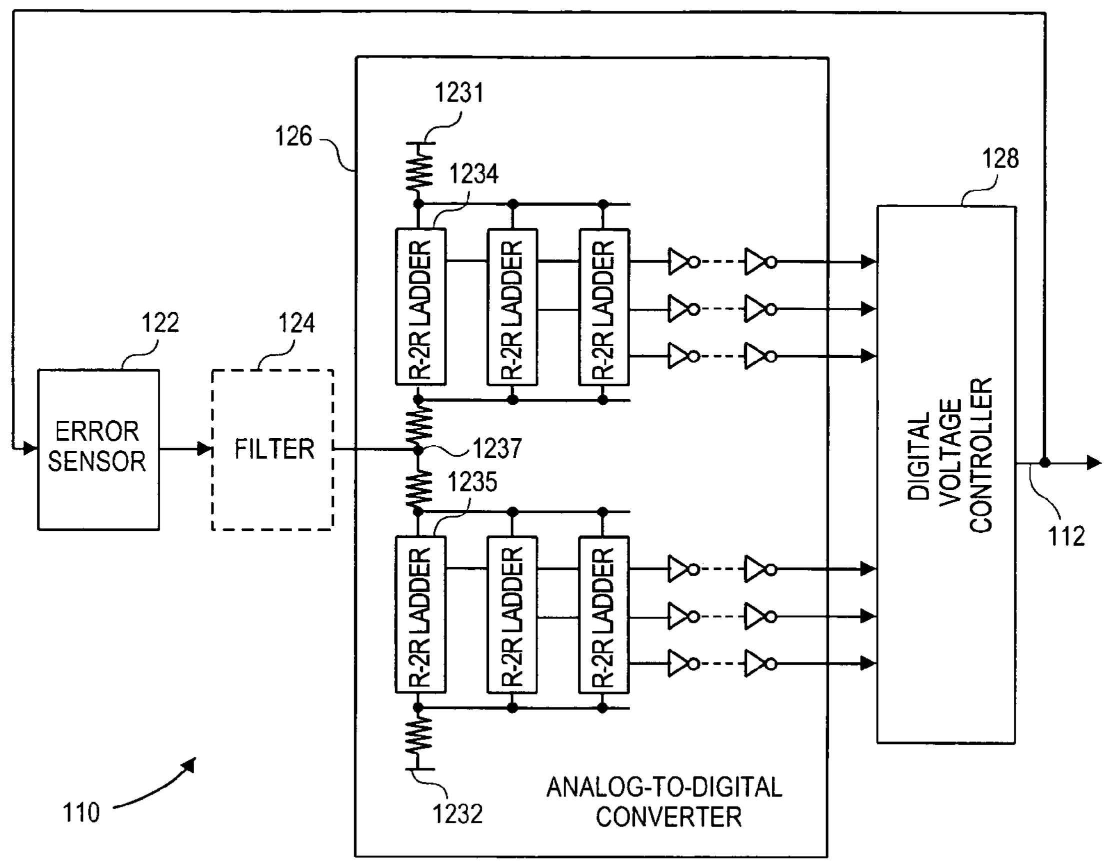
FIG. 12 illustrates, for another embodiment, example circuitry to implement an analog-to-digital converter for the voltage regulator of FIG. 1.

Analog-to-digital converter 126 for one embodiment, as illustrated in FIG. 12, may comprise a resistive network having resistor ladders, such as R-2R ladders 1234 and 1235 for example, coupled between a supply node 1231 and another supply node 1232. Supply node 1231 for one embodiment may correspond to supply node 111 of FIG. 1, and supply node 1232 for one embodiment may correspond to supply node 115 of FIG. 1.

Such a resistive network for one embodiment may be coupled to receive an analog voltage signal from error sensor 122 at an input node 1237. Although illustrated as having three R-2R ladders coupled in parallel between supply node 1231 and input node 1237 and three R-2R ladders coupled in parallel between input node 1237 and supply node 1232, the resistive network for one embodiment may comprise one R-2R ladder or a plurality of parallel R-2R ladders coupled between supply node 1231 and input node 1237 and may comprise one R-2R ladder or a plurality of parallel R-2R ladders coupled between input node 1237 and supply node 1232.

For one embodiment, R-2R ladders may help subdivide the voltage across supply node 1231 and input node 1237 and across input node 1237 and supply node 1232 with a substantially constant output impedance to help produce substantially the same resistance-capacitance (RC) delay for driving buffers of analog-to-digital converter 126. The R-2R ladders for one embodiment may then help improve the speed of voltage regulator 110 with no or minimal increase in power consumption relative, for example, to the resistive network illustrated in FIG. 3 where the RC delay for driving buffers farther from input node 337 may be larger than for buffers closer to input node 337.

Alternative Error Sensor

Figure 13:
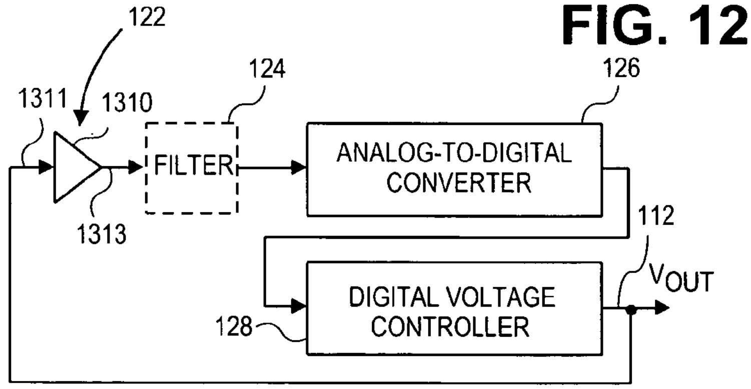
FIG. 13 illustrates, for another embodiment, example circuitry to implement an error sensor for the voltage regulator of FIG. 1.

As illustrated in FIG. 13, error sensor 122 for one embodiment may comprise circuitry to implement a self-biased error amplifier 1310. An input terminal 1311 of self-biased error amplifier 1310 may be coupled to receive the output supply voltage $V_{OUT}$ signal at output node 112. Self-biased error amplifier 1310 may comprise any suitable circuitry to sense error in the output supply voltage $V_{OUT}$ signal and generate at an output terminal 1313 an amplified analog voltage signal representative of the error.

Self-biased error amplifier 1310 for one embodiment may be used for AC-only regulation. Filter 124 for one embodiment may then be used to remove the direct current (DC) component and optionally one or more frequency components of the analog signal at output terminal 1313.

Figure 14:
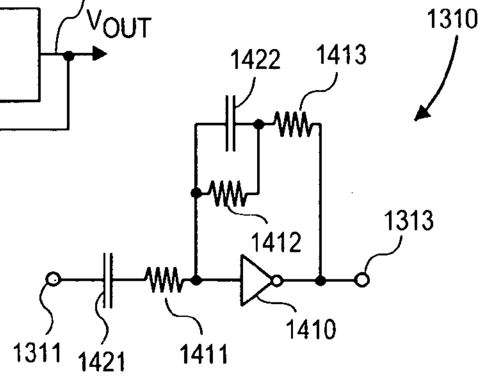
FIG. 14 illustrates, for one embodiment, example circuitry to implement a self-biased error amplifier and filter for the voltage regulator of FIG. 13.

Self-biased error amplifier 1310 and filter 124 for one embodiment, as illustrated in FIG. 14, may comprise an inverter 1410; resistors 1411, 1412, and 1413; and capacitors 1421 and 1422. Capacitor 1421 and resistor 1411 may be coupled in series between input terminal 1311 and the input of inverter 1410. Resistor 1412 and capacitor 1422 may be coupled in parallel across the input and output of inverter 1410. Resistor 1413 may also be coupled across the input and output of inverter 1410 and in series with the parallel-coupled resistor 1412 and capacitor 1422. Inverter 1410 may be coupled to receive the output supply voltage $V_{OUT}$ signal at input terminal 1311 and to generate at output terminal 1313 an amplified analog voltage signal representative of the error in the output supply voltage $V_{OUT}$ signal in response to the output supply voltage $V_{OUT}$ signal.

For one embodiment where analog-to-digital converter 126 comprises buffers that effectively act as comparators to generate digital signals, the bias point of self-biased error amplifier 1310 for one embodiment may generally match a voltage trip point of such buffers to help reduce or prevent DC current flow at output node 112. For additional margin, the bias point of self-biased error amplifier 1310 for another embodiment may be slightly offset from the voltage trip point of such buffers to help prevent current flow at output node 112 when the output supply voltage $V_{OUT}$ signal is relatively steady.

Alternative Error Sensor and Analog-to-Digital Converter

Figure 15:
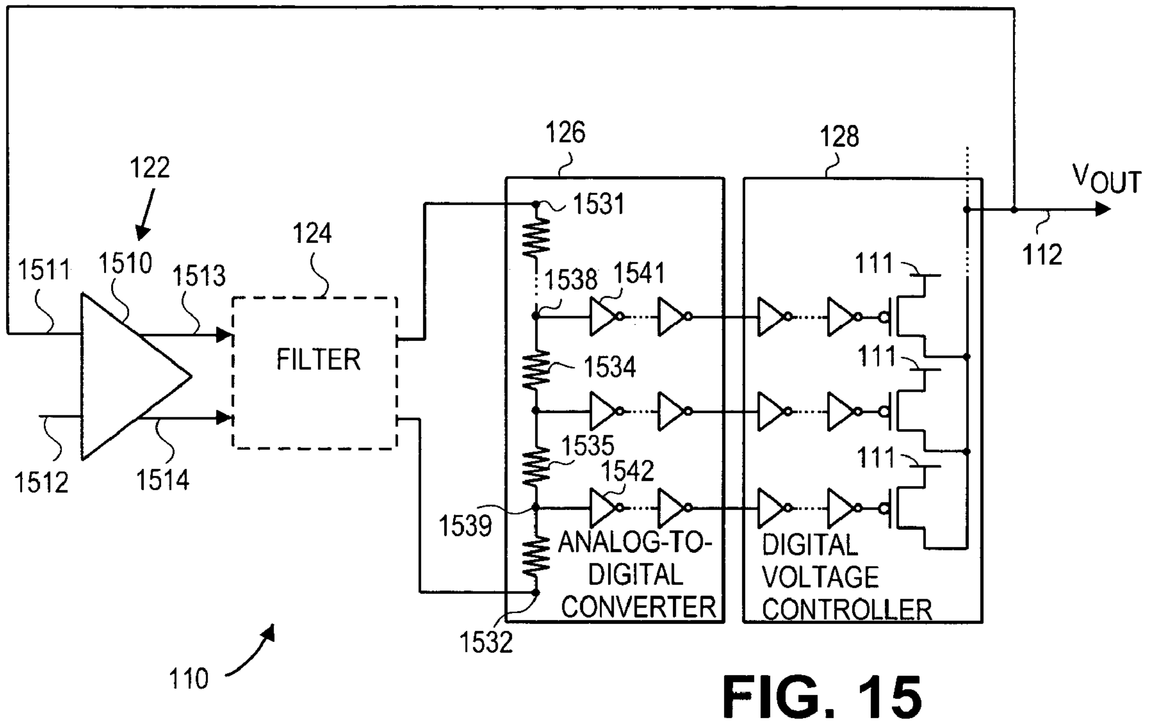
FIG. 15 illustrates, for another embodiment, example circuitry to implement an error sensor, an analog-to-digital converter, and a digital voltage controller for the voltage regulator of FIG. 1.

FIG. 15 illustrates, for another embodiment, example circuitry to implement voltage regulator 110 of FIG. 1.

As illustrated in FIG. 15, error sensor 122 for one embodiment may comprise circuitry to implement a dual output error amplifier 1510. An input terminal 1511 of dual output error amplifier 1510 may be coupled to receive the output supply voltage $V_{OUT}$ signal at output node 112 and another input terminal 1512 of dual output error amplifier 1510 may be coupled to receive a reference voltage $V_{REF}$ signal supplied by reference voltage generator 118. Dual output error amplifier 1510 may comprise any suitable circuitry to sense the difference in voltage between the output supply voltage $V_{OUT}$ signal and the reference voltage $V_{REF}$ signal and generate at output terminals 1513 and 1514 dual analog voltage signals representative of the difference. Dual output error amplifier 1510 for one embodiment may generate at output terminals 1513 and 1514 dual analog voltage signals having a substantially constant voltage difference between one another.

Figure 16:
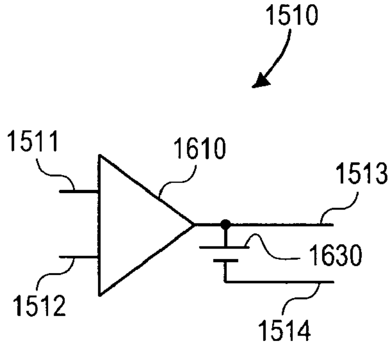
FIG. 16 illustrates, for one embodiment, example circuitry to implement a dual output error amplifier for the error sensor of FIG. 15.

Dual output error amplifier 1510 for one embodiment, as illustrated in FIG. 16, may comprise a differential error amplifier 1610 and a voltage source 1630. One input terminal of differential error amplifier 1610 may correspond to input terminal 1511 to receive the output supply voltage $V_{OUT}$ signal and another input terminal of differential error amplifier 1610 may correspond to input terminal 1512 to receive the reference voltage $V_{REF}$ signal. Differential error amplifier 1610 may comprise any suitable circuitry to sense the difference in voltage between the output supply voltage $V_{OUT}$ signal and the reference voltage $V_{REF}$ signal and generate at output terminal 1513 an amplified analog voltage signal representative of the difference. Voltage source 1630 for one embodiment may be coupled between output terminal 1513 and output terminal 1514 to generate at output terminal 1514 an analog voltage signal having a substantially constant voltage difference from the analog voltage signal at output terminal 1513.

Figure 17:
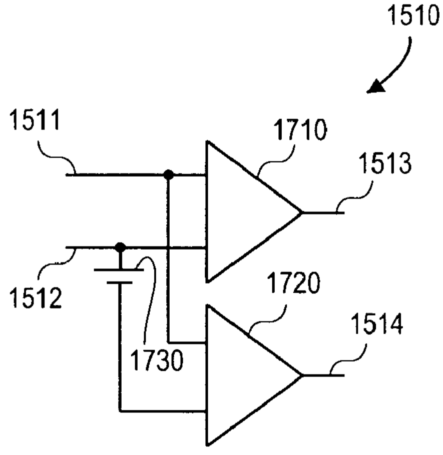
FIG. 17 illustrates, for another embodiment, example circuitry to implement a dual output error amplifier for the error sensor of FIG. 15.

Dual output error amplifier 1510 for another embodiment, as illustrated in FIG. 17, may comprise differential error amplifiers 1710 and 1720 and a voltage source 1730.

One input terminal of differential error amplifier 1710 may correspond to input terminal 1511 to receive the output supply voltage $V_{OUT}$ signal and another input terminal of differential error amplifier 1710 may correspond to input terminal 1512 to receive the reference voltage $V_{REF}$ signal. Differential error amplifier 1710 may comprise any suitable circuitry to sense the difference in voltage between the output supply voltage $V_{OUT}$ signal and the reference voltage $V_{REF}$ signal and generate at output terminal 1513 an amplified analog voltage signal representative of the difference.

One input terminal of differential error amplifier 1720 may correspond to input terminal 1511 to receive the output supply voltage $V_{OUT}$ signal. Voltage source 1730 may be coupled between input terminal 1512 and another input terminal of differential error amplifier 1720. The other input terminal of differential error amplifier 1720 may then receive an offset reference voltage signal having a substantially constant voltage difference from the reference voltage $V_{REF}$ signal. Differential error amplifier 1720 may comprise any suitable circuitry to sense the difference in voltage between the output supply voltage $V_{OUT}$ signal and the offset reference voltage signal and generate at output terminal 1514 an amplified analog voltage signal representative of the difference. The analog voltage signal at output terminal 1514 may then have a substantially constant voltage difference from the analog voltage signal at output terminal 1513.

Error sensor 122 for one embodiment may comprise circuitry to implement a self-biased dual output error amplifier (not shown). Such a dual output error amplifier for one embodiment may comprise two self-biased single-output amplifiers that have shorted inputs and that have skewed trip points to achieve a substantially constant voltage difference between the outputs.

As illustrated in FIG. 15, analog-to-digital converter 126 for one embodiment may comprise circuitry to implement a flash analog-to-digital converter coupled to receive dual analog voltage signals from error sensor 122 and to generate and output digital signals for digital voltage controller 128 in response to the received dual analog voltage signals. Analog-to-digital converter 126 for one embodiment may comprise circuitry to generate and output digital signals representative of a thermometer code in response to the received dual analog voltage signals.

Analog-to-digital converter 126 for one embodiment may comprise a resistive network coupled to receive dual analog voltage signals from error sensor 122 to generate analog voltage signals in response to the received dual analog voltage signals. Analog-to-digital converter 126 for one embodiment may also comprise a plurality of buffers coupled to receive analog signals from the resistive network to generate digital signals in response to the received analog signals.

Analog-to-digital converter 126 for one embodiment may comprise buffers coupled to receive analog signals generated from one or more resistive trees driven by the dual analog voltage signals from error sensor 122. For one embodiment, as illustrated in FIG. 15, analog-to-digital converter 126 may comprise buffers, such as inverting buffers 1541 and 1542 for example, coupled to receive analog signals generated from a resistive tree coupled in series between input nodes 1531 and 1532. Input node 1531 for one embodiment may be coupled to receive an analog voltage signal from output terminal 1513, and input node 1532 for one embodiment may be coupled to receive an analog voltage signal from output terminal 1514.

The resistive tree for one embodiment may comprise a plurality of resistors, such as resistors 1534 and 1535 for example, coupled in series between input node 1531 and input node 1532 to generate one or more analog signals at one or more corresponding nodes, such as nodes 1538 and 1539 for example, of the resistive tree in response to the received dual analog voltage signals. For one embodiment, driving a resistive tree from two sides may help produce higher gain for the node(s) of the resistive tree and may help produce a generally linear response with resistors of substantially equal size. Although illustrated as having four resistors coupled in series to define three nodes at which analog signals may be generated, the resistive tree may comprise any suitable number of resistors of any suitable size to generate one or more analog signals at any suitable number of one or more nodes.

Although illustrated as having two inverting buffers coupled in series at a corresponding node of a resistive network, analog-to-digital converter 126 may comprise any suitable number of one or more non-inverting and/or inverting buffers at a corresponding node of a resistive network. Analog-to-digital converter 126 for another embodiment may comprise a plurality of differential comparators coupled to receive analog signals from a resistive network to generate digital signals in response to the received analog signals.

As illustrated in FIG. 15, digital voltage controller 128 for one embodiment may comprise circuitry to implement a digital-to-analog converter coupled to receive digital signals from analog-to-digital converter 126 and to control the output supply voltage $V_{OUT}$ signal at output node 112 in response to the received digital signals.

Although illustrated in FIG. 15 as having three p-channel field effect transistors (pFETs) to couple output node 112 to supply node 111 when activated by corresponding digital signals received from analog-to-digital converter 126 and buffered by corresponding inverter pairs, digital voltage controller 128 for another embodiment may comprise any suitable alternative circuitry such as, for example, the circuitry described in connection with FIGS. 3, 6, 8, and 10.

EXAMPLE APPLICATION

Voltage regulator 110 may be used for any suitable purpose. Voltage regulator 110 for one embodiment may be used, for example, to help bring higher voltages onto integrated circuit 100 to help reduce current demands.

Voltage regulator 110 for one embodiment may be used as a linear regulator. Voltage regulator 110 for one embodiment may convert the input supply voltage $V_{IN}$ signal from power supply 102 to supply a different output supply voltage $V_{OUT}$ signal to load 116. As one example, voltage regulator 110 may convert a supply voltage signal having a higher voltage into one having a lower voltage. The circuit(s) of load 116 for one embodiment may be designed to operate using a lower supply voltage signal to help reduce power consumption by integrated circuit 100.

Voltage regulator 110 for one embodiment may be used as a biasing circuit for a switching regulator on an integrated circuit. Such a switching regulator may be used, for example, to convert a higher supply voltage signal to a lower supply voltage signal.

Voltage regulator 110 for one embodiment may operate as an AC voltage clamping circuit for power grid resonance suppression, for example.

Voltage regulator 110 for one embodiment may be used to supply a regulated output supply voltage $V_{OUT}$ signal for use in any suitable integrated circuit for use in any suitable system. As one example, voltage regulator 110 may be used in an integrated circuit forming at least a portion of any suitable processor for use, for example, in any suitable computer system and/or control system. Although illustrated in FIG. 1 as being integrated on integrated circuit 100, voltage regulator 110 for one embodiment may have only a portion integrated on a single integrated circuit.

Figure 18:
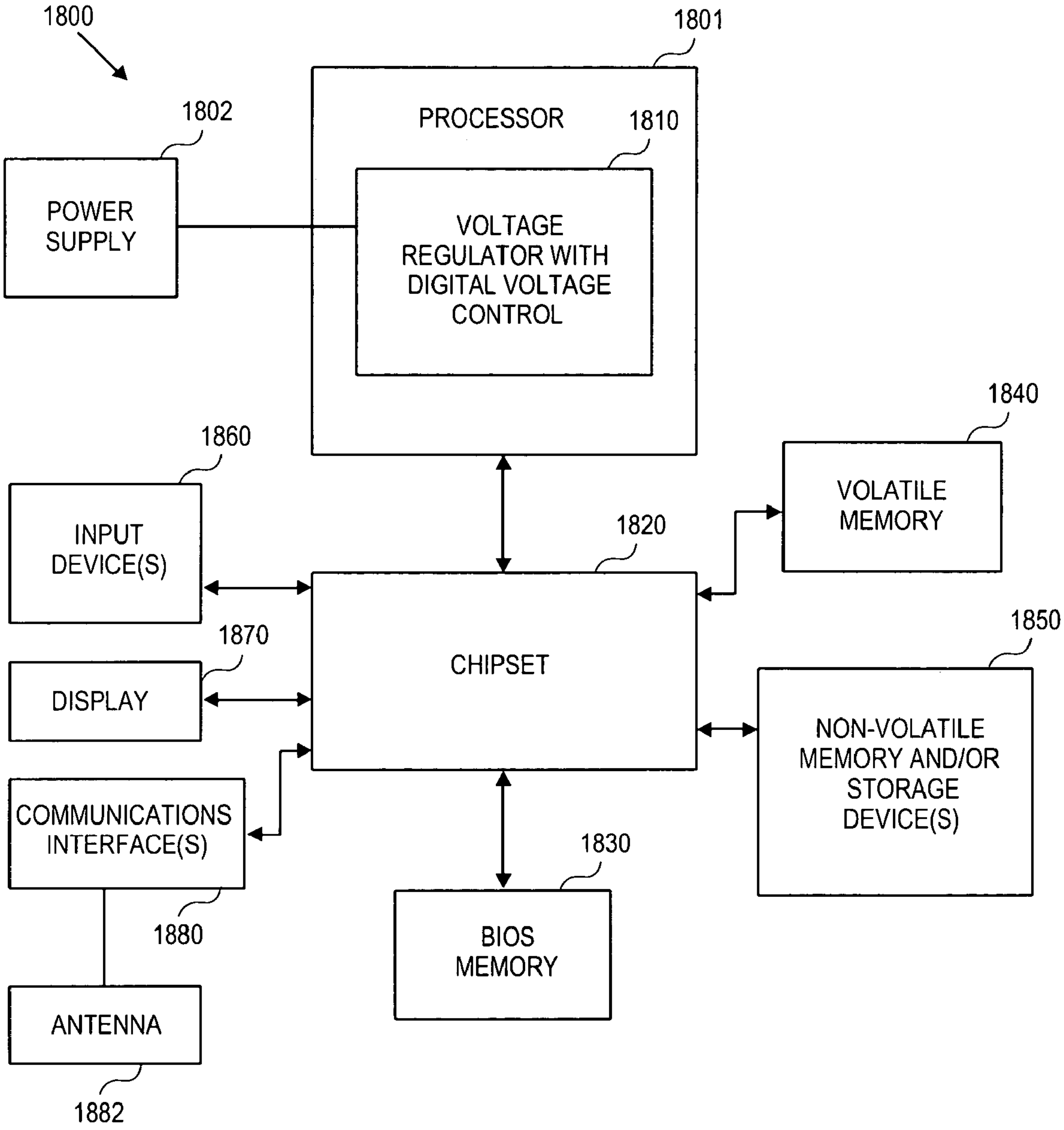
FIG. 18 illustrates, for one embodiment, an example system comprising a processor having a voltage regulator with digital voltage control.

FIG. 18 illustrates, for one embodiment, an example system 1800 comprising a processor 1801 having a voltage regulator 1810 with digital voltage control and a power supply 1802. Processor 1801 for one embodiment may be coupled to power supply 1802 to generate an input supply voltage signal for voltage regulator 1810. Voltage regulator 1810 may be used to supply a regulated output supply voltage signal for use in any suitable one or more portions of an integrated circuit of processor 1801. Voltage regulator 1810 and power supply 1802 generally correspond to voltage regulator 110 and power supply 102 of FIG. 1. Power supply 1802 for one embodiment may comprise a battery. Power supply 1802 for another embodiment may comprise an alternating current to direct current (AC-DC) converter. Power supply 1802 for another embodiment may comprise a DC-DC converter.

As illustrated in FIG. 18, system 1800 also comprises a chipset 1820 coupled to processor 1801, a basic input/output system (BIOS) memory 1830 coupled to chipset 1820, volatile memory 1840 coupled to chipset 1820, non-volatile memory and/or storage device(s) 1850 coupled to chipset 1820, one or more input devices 1860 coupled to chipset 1820, a display 1870 coupled to chipset 1820, and one or more communications interfaces 1880 coupled to chipset 1820.

Chipset 1820 for one embodiment may comprise any suitable interface controllers to provide for any suitable communications link to processor 1801 and/or to any suitable device or component in communication with chipset 1820.

Chipset 1820 for one embodiment may comprise a firmware controller to provide an interface to BIOS memory 1830. BIOS memory 1830 may be used to store any suitable system and/or video BIOS software for system 1800. BIOS memory 1830 may comprise any suitable non-volatile memory, such as a suitable flash memory for example. BIOS memory 1830 for one embodiment may alternatively be included in chipset 1820.

Chipset 1820 for one embodiment may comprise one or more memory controllers to provide an interface to volatile memory 1840. Volatile memory 1840 may be used to load and store data and/or instructions, for example, for system 1800. Volatile memory 1840 may comprise any suitable volatile memory, such as suitable dynamic random access memory (DRAM) for example.

Chipset 1820 for one embodiment may comprise one or more input/output (I/O) controllers to provide an interface to non-volatile memory and/or storage device(s) 1850, input device(s) 1860, and communications interface(s) 1880. Non-volatile memory and/or storage device(s) 1850 may be used to store data and/or instructions, for example. Non-volatile memory and/or storage device(s) 1850 may comprise any suitable non-volatile memory, such as flash memory for example, and/or may comprise any suitable non-volatile storage device(s), such as one or more hard disk drives (HDDs), one or more compact disc (CD) drives, and/or one or more digital versatile disc (DVD) drives for example. Input device(s) 1860 may comprise any suitable input device(s), such as a keyboard, a mouse, and/or any other suitable cursor control device. Communications interface(s) 1880 provide an interface for system 1800 to communicate over one or more networks and/or with any other suitable device. Communications interface(s) 1880 may comprise any suitable hardware and/or firmware. Communications interface(s) 1880 for one embodiment may comprise, for example, a network adapter, a wireless network adapter, a telephone modem, and/or a wireless modem. For wireless communications, communications interface(s)

1880 for one embodiment may use one or more antennas, such as antenna 1882 for example.

Chipset 1820 for one embodiment may comprise a graphics controller to provide an interface to display 1870. Display 1870 may comprise any suitable display, such as a cathode ray tube (CRT) or a liquid crystal display (LCD) for example. The graphics controller for one embodiment may alternatively be external to chipset 1820.

Although described as residing in chipset 1820, one or more controllers of chipset 1820 may be integrated with processor 1801, allowing processor 1801 to communicate with one or more devices or components directly. As one example, one or more memory controllers for one embodiment may be integrated with one or more of processor 1801, allowing processor 1801 to communicate with volatile memory 1840 directly.

In the foregoing description, example embodiments have been described. Various modifications and changes may be made to such embodiments without departing from the scope of the appended claims. The description and drawings are, accordingly, to be regarded in an illustrative rather than a restrictive sense.

What is claimed is:

1. A method comprising:

sensing an error in a supply voltage signal supplied at an output node to a varying load;

generating one or more analog signals based on the error;

converting one or more generated analog signals into one or more digital signals representative of a thermometer code; and controlling the supply voltage signal at the output node in response to the one or more digital signals.

2. The method of claim 1, wherein the controlling comprises generating current at the output node in response to the one or more digital signals.

3. An apparatus comprising:

error sensor circuitry comprising a differential error amplifier to sense an error in a supply voltage signal supplied at an output node to a varying load and to generate one or more analog signals based on the error;

analog-to-digital converter circuitry to convert one or more generated analog signals into one or more digital signals; and digital voltage controller circuitry to control the supply voltage signal at the output node in response to the one or more digital signals.

4. The apparatus of claim 3, wherein the error sensor circuitry comprises a self-biased error amplifier.

5. An apparatus comprising:

error sensor circuitry comprising a dual output error amplifier to sense an error in a supply voltage signal supplied at an output node to a varying load and to generate one or more analog signals based on the error;

analog-to-digital converter circuitry to convert one or more generated analog signals into one or more digital signals; and digital voltage controller circuitry to control the supply voltage signal at the output node in response to the one or more digital signals.

6. An apparatus comprising:

error sensor circuitry comprising a dual output error amplifier to sense an error in a supply voltage signal supplied at an output node to a varying load and to generate one or more analog signals based on the error;

analog-to-digital converter circuitry to convert one or more generated analog signals into one or more digital signals, the analog-to-digital converter circuitry comprising a resistive network to generate analog signals in response to one or more analog signals from the error sensor circuitry, and a plurality of buffers to generate digital signals in response to analog signals generated by the resistive network; and digital voltage controller circuitry to control the supply voltage signal at the output node in response to the one or more digital signals.

7. The apparatus of claim 6, wherein the resistive network comprises a first resistive tree coupled between a first supply node and an input node and a second resistive tree coupled between the input node and a second supply node, wherein the input node is coupled to receive an analog signal from the error sensor circuitry.

8. The apparatus of claim 6, wherein the resistive network has resistor ladders.

9. The apparatus of claim 6, wherein the resistive network comprises R-2R ladders coupled in parallel between a first supply node and an input node and R-2R ladders coupled in parallel between the input node and a second supply node, wherein the input node is coupled to receive an analog signal from the error sensor circuitry.

10. The apparatus of claim 6, wherein the resistive network comprises a resistive tree coupled between two input nodes coupled to receive analog signals from the error sensor circuitry.

11. An apparatus comprising:

error sensor circuitry comprising a dual output error amplifier to sense an error in a supply voltage signal supplied at an output node to a varying load and to generate one or more analog signals based on the error;

analog-to-digital converter circuitry to convert one or more generated analog signals into one or more digital signals; and digital voltage controller circuitry to control the supply voltage signal at the output node in response to the one or more digital signals, wherein the digital voltage controller circuitry comprises a plurality of transistors to couple the output node to one or more supply nodes in response to digital signals from the analog-to-digital converter circuitry.

12. A voltage regulator comprising:

an error amplifier coupled to receive a voltage signal corresponding to an output voltage signal, the error amplifier being a differential error amplifier, a self-biased error amplifier, or a dual output error amplifier;

a flash analog-to-digital converter coupled to receive one or more analog signals from the error amplifier to generate thermometer code digital signals; and a digital-to-analog converter coupled to receive thermometer code digital signals from the flash analog-to-digital converter to generate the output voltage signal.

13. The voltage regulator of claim 12, comprising a filter coupled to receive one or more analog signals from the error amplifier, wherein the flash analog-to-digital converter is coupled to receive one or more analog signals from the filter.

* * * * *